(12) United States Patent
Hayahara et al.

(10) Patent No.: US 9,209,061 B2
(45) Date of Patent: Dec. 8, 2015

(54) ELECTROSTATIC CHUCK DEVICE

(71) Applicant: Sumitomo Osaka Cement Co., Ltd., Tokyo (JP)

(72) Inventors: Ryuuji Hayahara, Tokyo (JP); Kazunori Ishimura, Tokyo (JP); Mamoru Kosakai, Tokyo (JP)

(73) Assignee: Sumitomo Osaka Cement Co., Ltd., Tokyo (JP)

( * ) Notice: Subject to any disclaimer, the term of this patent is extended or adjusted under 35 U.S.C. 154(b) by 75 days.

(21) Appl. No.: 14/345,967

(22) PCT Filed: Sep. 26, 2012

(86) PCT No.: PCT/JP2012/074642
§ 371 (c)(1),
(2) Date: Mar. 20, 2014

(87) PCT Pub. No.: WO2013/047555
PCT Pub. Date: Apr. 4, 2013

(65) Prior Publication Data
US 2014/0301010 A1    Oct. 9, 2014

(30) Foreign Application Priority Data
Sep. 28, 2011 (JP) .................................. 2011-212955

(51) Int. Cl.
*H01L 21/683* (2006.01)
*H01T 23/00* (2006.01)
*H01L 21/67* (2006.01)

(52) U.S. Cl.
CPC ...... *H01L 21/6833* (2013.01); *H01L 21/67109* (2013.01); *H01L 21/6831* (2013.01)

(58) Field of Classification Search
USPC ......................................................... 361/234
See application file for complete search history.

(56) References Cited

U.S. PATENT DOCUMENTS 6,462,928 B1 * 10/2002 Shamouilian et al. ........ 361/234
6,538,872 B1 *  3/2003 Wang et al. ................... 361/234
(Continued)

FOREIGN PATENT DOCUMENTS

JP    08-274147 A   10/1996
JP    11-220008 A    8/1999
(Continued)

OTHER PUBLICATIONS

JP-2010-040644; Electrostatic chuck device; All Figures; Entier specificaton.*

(Continued)

*Primary Examiner* — Dharti Patel
(74) *Attorney, Agent, or Firm* — Wood, Herron & Evans, LLP

(57) ABSTRACT

An electrostatic chuck device is provided in which it is possible to uniformize an in-plane temperature distribution in a placement surface on which a plate-shaped sample such as a wafer is placed and it is possible to improve in-plane uniformity of plasma etching of the plate-shaped sample by uniformizing plasma density on the plate-shaped sample. The electrostatic chuck device includes an electrostatic chuck section that has an upper surface as a placement surface on which a plate-shaped sample is placed, and is made to have an internal electrode for electrostatic adsorption built-in, and a cooling base section that cools the electrostatic chuck section, wherein a heater element (4) having a heater pattern (21) of a predetermined shape is provided between the electrostatic chuck section and the cooling base section, and an island-shaped portion (24) that is independent from the heater pattern (21) and is made of the same material as the heater pattern (21) is provided in a gap portion (23) of the heater pattern (21).

4 Claims, 2 Drawing Sheets

(56) References Cited

U.S. PATENT DOCUMENTS

| | | |
|---|---|---|
| 6,853,533 B2 * | 2/2005 | Parkhe .................... 361/234 |
| 8,940,115 B2 * | 1/2015 | Shimazu ..................... 156/87 |

FOREIGN PATENT DOCUMENTS

| | | |
|---|---|---|
| JP | 11-297806 A | 10/1999 |
| JP | 2002-313900 A | 10/2002 |
| JP | 2002-373862 A | 12/2002 |
| JP | 2010-040644 A | 2/2010 |
| JP | 2010-129766 A | 6/2010 |

OTHER PUBLICATIONS

Japanese Patent Office, International Search Report issued in Application No. PCT/JP2012-074642, mailed Dec. 25, 2012, 4 pages.

* cited by examiner

ELECTROSTATIC CHUCK DEVICE

TECHNICAL FIELD

The present invention relates to an electrostatic chuck device and more specifically, to an electrostatic chuck device which is used for proper adsorbing and fixing of a plate-shaped sample such as a semiconductor wafer by an electrostatic force in plasma treatment such as plasma etching in a semiconductor manufacturing process and in which it is possible to uniformize an in-plane temperature distribution in a placement surface for the plate-shaped sample and it is possible to improve in-plane uniformity of plasma etching of the plate-shaped sample by uniformizing plasma density on the plate-shaped sample.

Priority is claimed based on Japanese Patent Application No. 2011-212955 filed on Sep. 28, 2011, the contents of which are incorporated herein by reference.

BACKGROUND ART

In recent years, in a semiconductor manufacturing process, further improvement in a fine processing technology using higher integration or higher performance of an element has been required. In the semiconductor manufacturing process, an etching technology is an important one type of fine processing technology types, and in recent years, among etching technologies, a plasma etching technology that forms a fine pattern in a solid material by radicals (free radicals) which are generated from plasma has become mainstream as a technology that is highly efficient and that enables fine processing of a large area.

On the other hand, there is a plasma CVD method, as a type of thin film growth technology in which source gases are combined by the action of plasma and the obtained compound is deposited on a substrate. This method is a film formation method in which plasma discharge is caused by applying a high-frequency electric field to gas including source molecules, then, the source molecules are decomposed by electrons accelerated by the plasma discharge, and the obtained compound is deposited. Even if it is reaction which does not occur just from thermal excitation at low temperature, since gases in a system collide with each other and are activated in plasma, the gases turn into radicals, and thus, reaction can occur.

In a semiconductor manufacturing apparatus using plasma, such as a plasma etching apparatus or a plasma CVD apparatus, in the past, as a device to easily mount and fix a wafer onto a sample stage and also maintain the wafer at a desired temperature, an electrostatic chuck device provided with an electrostatic chuck section that has a placement surface where a wafer is placed, and is made to have an internal electrode for electrostatic adsorption built-in, and a cooling base section that cools the electrostatic chuck section, have been used.

Incidentally, in an existing plasma etching apparatus, it is necessary to raise temperature to a desired temperature by heating a wafer. However, in the temperature rising process, a temperature distribution occurs in the in-plane of the wafer. For example, at a central portion of the wafer, temperature becomes high, and at a marginal portion, temperature becomes low.

Further, a difference occurs in an in-plane temperature distribution of the wafer due to a difference in structure or method of the plasma etching apparatus.

Therefore, in order to reduce the in-plane temperature distribution of the wafer, there is proposed an electrostatic chuck device with a heater function in which a spiral or serpentine heater pattern formed between an electrostatic chuck section and a cooling base section is made to be a two-zone heater pattern which includes an inner heater pattern and an outer heater pattern and the heater patterns of the respective zones are individually controlled (refer to, for example, PTL 1 or the like), a ceramic heater in which an in-plane temperature distribution of an adsorption surface for a wafer is reduced by forming a heater pattern in a plurality of layers in a vertical direction (refer to, for example, PTL 2 or the like), and the like.

The electrostatic chuck device with heater function is obtained by fabricating an electrostatic chuck section with a built-in heater or with a heater mounted therein by a method of having a heater built in an electrostatic chuck section made of ceramic, a method of mounting a heater by coating a heater material on the back side of an adsorption surface of an electrostatic chuck section, that is, the rear surface of a ceramic plate-shaped body in a predetermined pattern by a screen printing method and performing thermal curing, a method of mounting a heater by sticking metal foil or a sheet-like conducting material to the rear surface of a ceramic plate-shaped body, or the like, and bonding and integrating the electrostatic chuck section and a cooling base section that cools the electrostatic chuck section, through an organic adhesive layer.

CITATION LIST

Patent Literature

[PTL 1] Japanese Unexamined Patent Application Publication No. 11-297806
[PTL 2] Japanese Unexamined Patent Application Publication No. 2002-373862

SUMMARY OF INVENTION

Technical Problem

Incidentally, in the electrostatic chuck device with heater function of the related art described above, in order to reduce an in-plane temperature distribution in a placement surface on which the wafer is placed, the heater pattern is divided into a plurality of zones and the heater patterns of the respective zones are individually controlled. However, there is a problem in that it is difficult to obtain a uniform in-plane temperature distribution in the placement surface on which the wafer is placed.

Certainly, if the heater pattern is divided into a plurality of zones and the heater patterns of the respective zones are individually controlled, a difference in temperature in an in-plane temperature distribution of the wafer decreases. However, there is a problem in that it is difficult to further uniformize the in-plane temperature distribution of the wafer which is required by current plasma etching technology. Currently, when higher efficiency and fine processing of larger area are necessary, further uniformizing of the in-plane temperature distribution of the wafer in response to an advanced plasma etching technology is difficult at the present stage.

The present invention has been made in view of the above-described circumstances and has an object to provide an electrostatic chuck device in which it is possible to uniformize an in-plane temperature distribution in a placement surface on which a plate-shaped sample such as a wafer is placed and it is possible to improve in-plane uniformity of plasma etching of the plate-shaped sample by uniformizing plasma density on the plate-shaped sample.

Solution to Problem

The inventors of the present invention have performed intensive studies in order to solve the above-described problems, as a result, have found that in an electrostatic chuck device provided with an electrostatic chuck section that has a principal surface as a placement surface on which a plate-shaped sample is placed, and is made to have an internal electrode for electrostatic adsorption built-in, and a cooling base section that cools the electrostatic chuck section, if a heating member having a heater pattern of a predetermined shape is provided between the electrostatic chuck section and the cooling base section and one or more island-shaped portions that are independent from the heater pattern and are made of the same material as the heater pattern are provided in any one or both of a gap portion of the heater pattern and an inside of the heater pattern, an in-plane temperature distribution in the placement surface on which the plate-shaped sample is placed is uniformized, have also found that if the heater pattern and the island-shaped portion are connected by a connection portion having a smaller cross-sectional area than the heater pattern, high-frequency permeability and a difference in potential are uniformized, whereby plasma density on the plate-shaped sample is uniformized, and thus the in-plane uniformity of plasma etching of the plate-shaped sample is improved, and have led to the completion of the invention.

That is, according to an aspect of the invention, there is provided an electrostatic chuck device including: an electrostatic chuck section that has a principal surface as a placement surface on which a plate-shaped sample is placed, and is made to have an internal electrode for electrostatic adsorption built-in; and a cooling base section that cools the electrostatic chuck section; wherein a heating member having a heater pattern of a predetermined shape is provided between the electrostatic chuck section and the cooling base section, and one or more island-shaped portions that are independent from the heater pattern and are made of the same material as the heater pattern are provided in any one or both of a gap portion of the heater pattern and the inside of the heater pattern.

In this electrostatic chuck device, the in-plane temperature distribution in the placement surface on which the plate-shaped sample is placed is uniformized by providing the heating member having the heater pattern of a predetermined shape between the electrostatic chuck section and the cooling base section and providing one or more island-shaped portions that are independent from the heater pattern and are made of the same material as the heater pattern, in any one or both of the gap portion of the heater pattern and the inside of the heater pattern.

In the electrostatic chuck device according to the above aspect of the invention, the heater pattern and the island-shaped portion may be connected by a connection portion having a smaller cross-sectional area than the heater pattern.

In this electrostatic chuck device, the heater pattern and the island-shaped portion are connected by the connection portion having a smaller cross-sectional area than the heater pattern, whereby the heater pattern configuring the heating member and the island-shaped portion are made to be equi-potential and the high-frequency permeability and a difference in potential of the entirety of the heating member which includes the heater pattern, the island-shaped portion, and the connection portion are uniformized. Therefore, the plasma density on the plate-shaped sample is uniformized, and thus the in-plane uniformity of plasma etching of the plate-shaped sample is improved.

In the electrostatic chuck device according to the above aspect of the invention, the heater pattern and the island-shaped portion or the connection portion may be made of a non-magnetic metal material.

In this electrostatic chuck device, the heater pattern and the island-shaped portion or the connection portion are made of a non-magnetic metal material, whereby it becomes difficult for the pattern shapes of the heater pattern and the island-shaped portion or the connection portion to be reflected in the plate-shaped sample and the in-plane temperature of the plate-shaped sample is easily maintained in a desired temperature pattern.

In the electrostatic chuck device according to the above aspect of the invention, the heater pattern and the island-shaped portion or the connection portion may be bonded to and integrated with the electrostatic chuck section and the cooling base section by an insulating organic adhesive material layer.

In this electrostatic chuck device, the heater pattern and the island-shaped portion or the connection portion are bonded to and integrated with the electrostatic chuck section and the cooling base section by the insulating organic adhesive material layer, whereby the insulating organic adhesive material layer relieves stress and a difference in thermal expansion between the electrostatic chuck section and the cooling base section.

Advantageous Effects of Invention

According to the electrostatic chuck device related to the above aspect to the invention, since the heating member having the heater pattern of a predetermined shape is provided between the electrostatic chuck section and the cooling base section and one or more island-shaped portions that are independent from the heater pattern and are made of the same material as the heater pattern are provided in any one or both of the gap portion of the heater pattern and the inside of the heater pattern, it is possible to uniformize an in-plane temperature distribution in the placement surface on which the plate-shaped sample is placed.

The heater pattern and the island-shaped portion are connected by the connection portion having a smaller cross-sectional area than the heater pattern, whereby it is possible to uniformize the high-frequency permeability and a difference in potential of the entirety of the heating member which includes the heater pattern and the island-shaped portion. Therefore, it is possible to uniformize plasma density on the plate-shaped sample, and thus it is possible to improve the in-plane uniformity of plasma etching of the plate-shaped sample.

The heater pattern and the island-shaped portion or the connection portion are made of a non-magnetic metal material, whereby it is possible to make it difficult for the pattern shapes of the heater pattern and the island-shaped portion or the connection portion to be reflected in the plate-shaped sample and it is possible to easily maintain the in-plane temperature of the plate-shaped sample in a desired temperature pattern.

The heater pattern and the island-shaped portion or the connection portion are bonded to and integrated with the electrostatic chuck section and the cooling base section by the insulating organic adhesive material layer, whereby it is possible to relieve stress and a difference in thermal expansion between the electrostatic chuck section and the cooling base section by the insulating organic adhesive material layer.

DESCRIPTION OF EMBODIMENTS

An embodiment for carrying out an electrostatic chuck device according to the invention will be described based on the drawings.

In addition, this embodiment is intended to be specifically described for better understanding of the gist of the invention and is not intended to limit the invention unless otherwise specified.

First Embodiment

Figure 1:
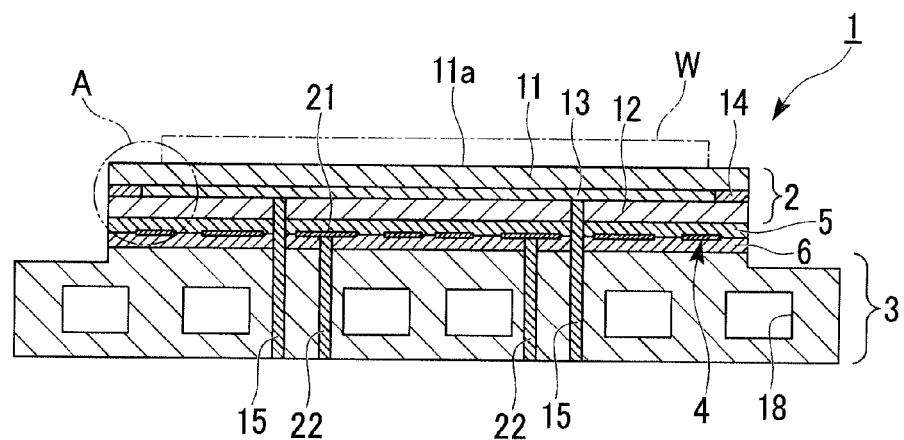
FIG. 1 is a cross-sectional view showing an electrostatic chuck device according to a first embodiment of the invention.

FIG. 1 is a cross-sectional view showing an electrostatic chuck device according to a first embodiment of the invention, and an electrostatic chuck device 1 is configured to include a disk-shaped electrostatic chuck section 2, a disk-shaped cooling base section 3 with a thickness, which cools the electrostatic chuck section 2 to a desired temperature, a heater element (a heating member) 4 provided between the electrostatic chuck section 2 and the cooling base section 3 and having a heater pattern of a predetermined shape, an insulating organic adhesive material layer 5 which bonds the upper surface of the heater element 4 to the lower surface of the electrostatic chuck section 2, and an insulating organic adhesive material layer 6 which bonds the lower surface of the heater element 4 to the upper surface of the cooling base section 3.

The electrostatic chuck section 2 is configured to include a placement plate 11, the upper surface (a principal surface) of which is a placement surface 11a on which a plate-shaped sample W such as a semiconductor wafer is placed, a support plate 12 which is integrated with the placement plate 11 and supports the placement plate 11, an internal electrode for electrostatic adsorption 13 provided between the placement plate 11 and the support plate 12, an insulating material layer 14 which is provided around the internal electrode for electrostatic adsorption 13 and isolates the internal electrode for electrostatic adsorption 13, and a terminal for power feeding 15 which is provided so as to pass through the support plate 12 and applies direct-current voltage to the internal electrode for electrostatic adsorption 13.

A configuration is made in which a plurality of projection portions (not shown) each having a diameter smaller than the thickness of the plate-shaped sample is formed on the placement surface of the placement plate 11, and the projection portions support the plate-shaped sample W.

The placement plate 11 and the support plate 12 have disk shapes in which the shapes of the surfaces at which the two are superimposed on one another are the same, and are each made of an insulating ceramic sintered body having mechanical strength and resistance to a corrosive gas and plasma thereof.

As the ceramic sintered body, if it is a material having volume resistivity in a range of $10^{13}$ Ω·cm to $10^{15}$ Ω·cm, mechanical strength, and resistance to a corrosive gas and plasma thereof, there is no particular limitation, and for example, an aluminum oxide ($Al_2O_3$) sintered body, an aluminum nitride (AlN) sintered body, an aluminum oxide-silicon carbide ($Al_2O_3$—SiC) composite sintered body, or the like is suitably used.

It is preferable that the thickness of the placement plate 11 be 0.2 mm or more and 1.5 mm or less, and particularly preferably, the thickness is 0.5 mm or more and 1.0 mm or less. The reason is because, if the thickness of the placement plate 11 is less than 0.2 mm, it is not possible to secure a sufficient withstand voltage, and on the other hand, if the thickness of the placement plate 11 exceeds 1.5 mm, an electrostatic adsorption force is reduced and in addition, thermal conductivity between the plate-shaped sample W which is placed on the placement surface 11a of the placement plate 11 and the cooling base section 3 is reduced, whereby it becomes difficult to maintain the temperature of the plate-shaped sample W in process, in a desired temperature pattern.

Further, it is preferable that the thickness of the support plate 12 be 0.5 mm or more and 2.8 mm or less, and particularly preferably, the thickness is 1.0 mm or more and 2.0 mm or less. The reason is because, if the thickness of the support plate 12 is less than 0.5 mm, it is not possible to secure a sufficient withstand voltage, and on the other hand, if the thickness of the support plate 12 exceeds 2.8 mm, thermal conductivity between the plate-shaped sample W which is placed on the placement surface 11a of the placement plate 11 and the cooling base section 3 is reduced, whereby it becomes difficult to maintain the temperature of the plate-shaped sample W in process, in a desired temperature pattern.

The internal electrode for electrostatic adsorption 13 is used as an electrode for an electrostatic chuck used to generate electric charges, thereby fixing the plate-shaped sample W by an electrostatic adsorption force, and the shape or the size thereof is appropriately adjusted depending on the use thereof.

It is preferable that the coefficient of thermal expansion of the internal electrode for electrostatic adsorption 13 be close to the coefficients of thermal expansion of the placement plate 11 and the support plate 12 as much as possible, and as such an electrode material, it is formed of, for example, conductive ceramics such as a silicon carbide (SiC) conductive sintered body, a titanium nitride ($Ti_3N_4$) conductive sintered body, a titanium carbide (TiC) conductive sintered body, an aluminum oxide-tantalum carbide ($Al_2O_3$—$Ta_4C_5$) conductive composite sintered body, an aluminum oxide-tungsten ($Al_2O_3$—W) conductive composite sintered body, an aluminum oxide-silicon carbide ($Al_2O_3$—SiC) conductive composite sintered body, an aluminum nitride-tungsten (AlN—W) conductive composite sintered body, or an aluminum nitride-tantalum (AlN—Ta) conductive composite sintered body, or high melting point metal such as tungsten (W), tantalum (Ta), molybdenum (Mo), or titanium (Ti), or a carbon material such as graphite or carbon.

The thickness of the internal electrode for electrostatic adsorption 13 is not particularly limited. However, it is preferable that the thickness of the internal electrode for electrostatic adsorption 13 be 0.1 μm or more and 100 μm or less, and particularly preferably, the thickness is 5 μm or more and 20 μm or less.

The reason is because, if the thickness is less than 0.1 μm, area resistance becomes too large, and thus it is not possible to secure sufficient electric conductivity, and on the other hand, if the thickness exceeds 100 μm, due to a difference in coefficient of thermal expansion between the internal electrode for electrostatic adsorption 13, and the placement plate 11 and the support plate 12, cracks easily occur in joint interfaces between the internal electrode for electrostatic adsorption 13 and the placement plate 11 and between the internal electrode for electrostatic adsorption 13 and the support plate 12.

The internal electrode for electrostatic adsorption 13 having such thickness can be easily formed by a film formation method such as a sputtering method or a vapor deposition method, or a coating method such as a screen printing method.

The insulating material layer 14 surrounds the internal electrode for electrostatic adsorption 13, thereby protecting the internal electrode for electrostatic adsorption 13 from a corrosive gas and plasma thereof and also joining and integrating a boundary portion between the placement plate 11 and the support plate 12, that is, an outer peripheral portion area outside the internal electrode for electrostatic adsorption 13, and is configured by an insulating material having the same composition or the same main component as that of a material configuring the placement plate 11 and the support plate 12.

The terminal for power feeding 15 is a rod-shaped terminal provided in order to apply direct-current voltage to the internal electrode for electrostatic adsorption 13, and the number, the shape, and the like thereof are determined depending on the form of the internal electrode for electrostatic adsorption 13, that is, depending on whether the internal electrode for electrostatic adsorption 13 is a monopolar type or a bipolar type.

As a material of the terminal for power feeding 15, if it is an electrically-conductive material having excellent heat resistance, there is no particular limitation. However, a material having a coefficient of thermal expansion close to the coefficients of thermal expansion of the internal electrode for electrostatic adsorption 13 and the support plate 12 is preferable, and for example, a metal material such as tungsten (W), tantalum (Ta), molybdenum (Mo), niobium (Nb), or a Kovar alloy, or various conductive ceramics are suitably used.

The terminal for power feeding 15 passes through the insulating organic adhesive material layers 5 and 6 and the cooling base section 3 and is connected to an external power supply (not shown).

It is preferable that the thickness of the electrostatic chuck section 2, that is, the total thickness of the placement plate 11, the support plate 12, the internal electrode for electrostatic adsorption 13, and the insulating material layer 14 be 0.7 mm or more and 5.0 mm or less. The reason is because, if the thickness of the electrostatic chuck section 2 is less than 0.7 mm, it is not possible to secure the mechanical strength of the electrostatic chuck section 2, and on the other hand, if the thickness of the electrostatic chuck section 2 exceeds 5.0 mm, the heat capacity of the electrostatic chuck section 2 becomes too large and as a result, the thermal responsiveness of the plate-shaped sample W which is placed thereon is degraded, and further, due to an increase in heat transfer in a lateral direction of the electrostatic chuck section 2, it becomes difficult to maintain the in-plane temperature of the plate-shaped sample W in a desired temperature pattern.

The cooling base section 3 is provided on the lower side of the electrostatic chuck section 2 to cool the electrostatic chuck section 2, thereby controlling the placement surface of the placement plate 11 to a desired temperature, and also serves as an electrode for high frequency generation.

A flow path 18 which circulates a medium for cooling such as water or an organic solvent is formed in the cooling base section 3 such that it is possible to maintain the temperature of the plate-shaped sample W which is placed on the placement plate 11 at a desired temperature.

As a material configuring the cooling base section 3, if it is metal having excellent thermal conductivity, electric conductivity, and workability, or a composite material that includes the metal, there is no particular limitation, and for example, aluminum (Al), an aluminum alloy, copper (Cu), a copper alloy, stainless steel (SUS), or the like is suitably used.

It is preferable that at least the surface which is exposed to plasma, of the cooling base section 3, be subjected to alumite treatment or an insulating film such as alumina be formed on the surface.

Figure 2:
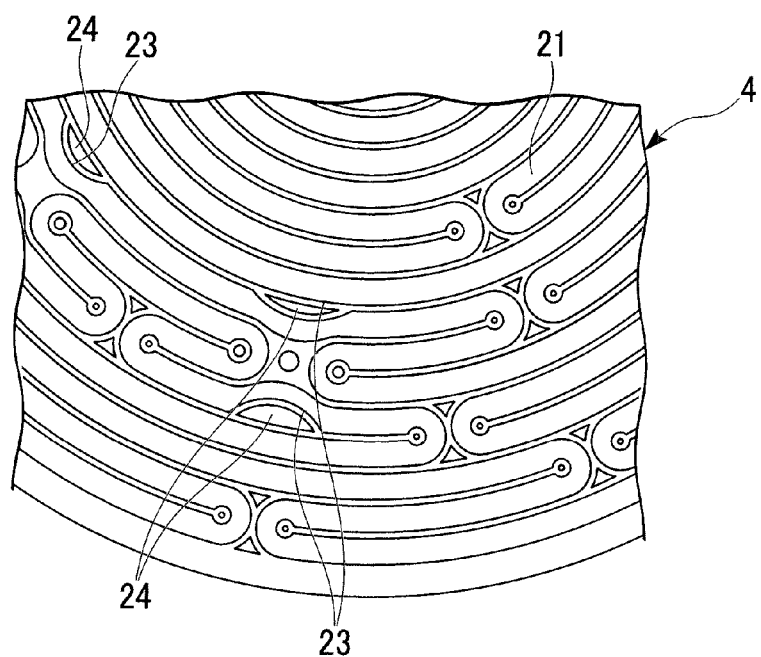
FIG. 2 is a plan view showing a heater element (a heating member) in an area A of the electrostatic chuck device according to the first embodiment of the invention.

The heater element 4 has a heater pattern 21 of a predetermined shape in which a single strip-shaped metal material is meandered, as shown in FIG. 2, and has a width of 10 mm (10000 μm) or less, preferably, 3 mm (3000 μm) or less, and a thickness of 300 μm or less, preferably, 100 μm or less. Further, the thickness is 1 μm or more, preferably, 10 μm or more. A terminal for power feeding 22 is connected to each of both end portions of the heater pattern 21.

The heater element 4 is formed by etching a non-magnetic metal thin plate, for example, a titanium (Ti) thin plate, a tungsten (W) thin plate, a molybdenum (Mo) thin plate, or the like into the heater pattern 21 of a desired shape.

Here, the reason that the thickness of the heater pattern 21 is set to be 300 μm or less is because, if the thickness exceeds 300 μm, a line width of the heater pattern 21 becomes narrow, and therefore, variation in processing accuracy of a line width when etching the heater pattern 21 increases and as a result, it becomes difficult to maintain the in-plane temperature of the plate-shaped sample W in a desired temperature pattern. Further, the reason that the thickness of the heater pattern 21 is set to be 1 μm or more is because, if the thickness of the heater pattern 21 is less than the value, resistance increases significantly, and in order to reduce the resistance, it is necessary to increase the width of the heater pattern 21, and therefore, it becomes difficult to design the heater pattern so as to make an in-plane temperature distribution in a placement surface uniform.

If the heater pattern 21 is formed of a non-magnetic metal thin plate, even if the electrostatic chuck device 1 is used in a high-frequency atmosphere, the heater element 4 does not perform self-heating by a high frequency and it becomes easy to maintain the in-plane temperature of the plate-shaped sample W at a desired constant temperature or in a constant temperature pattern, and therefore, it is preferable.

Further, if the heater pattern 21 is formed of a non-magnetic metal thin plate having constant thickness, the thickness of the heater pattern 21 becomes constant on the entire heating surface and the calorific value also becomes constant on the entire heating surface, and thus it is possible to uniformize the temperature distribution.

In the heater pattern 21, a gap portion 23 having a predetermined shape (in FIG. 2, an approximately crescent shape) is formed between the heater patterns 21 by moving parallel portions of the heater patterns 21 in a direction away from each other, and an island-shaped portion 24 having a predetermined shape (in FIG. 2, an approximately crescent shape), which is independent from the heater pattern 21, is provided in the gap portion 23.

The island-shaped portion 24 is formed by etching the same non-magnetic metal thin plate as that of the heater pattern 21, for example, a titanium (Ti) thin plate, a tungsten (W) thin plate, a molybdenum (Mo) thin plate, or the like into an island-shaped pattern of a desired shape.

The island-shaped portion 24 is an approximately crescent-shaped portion having a thickness of 300 μm or less, preferably, 100 μm or less, similar to the heater pattern 21.

The number and the arrangement of island-shaped portions 24 are appropriately set such that an in-plane temperature distribution in the placement surface 11a on which the plate-shaped sample W is placed is uniformized.

It is favorable if the distance between the island-shaped portion 24 and the heater pattern 21 is a distance of the extent that the island-shaped portion 24 can be electrically independent from the heater pattern 21, and the distance is 500 μm or more and 3000 μm or less, and preferably, 1000 μm or more and 2000 μm or less.

The island-shaped portion 24 which is independent from the heater pattern 21 and is made of the same material as that of the heater pattern 21 is provided in the heater pattern 21, whereby a difference in temperature between the portion of the heater pattern 21 and the portion except for the heater pattern 21 is eliminated in the heater element 4, and as a result, an in-plain temperature distribution in an upper portion of the heater element 4 is uniformized, and therefore, an in-plain temperature distribution in the placement surface 11a on which the plate-shaped sample W is placed is uniformized.

The heater pattern 21 may be configured by a single heater pattern, as described above, and may also be configured by two or more heater patterns which are independent from each other.

In this manner, if the heater pattern 21 is configured by two or more heater patterns which are independent from each other, by individually controlling the heater patterns which are independent from each other, it is possible to freely control the temperature of the plate-shaped sample W in process, and therefore, it is preferable.

It is favorable if the insulating organic adhesive material layers 5 and 6 are layers capable of bonding and integrating the heater element 4 to each of the electrostatic chuck section 2 and the cooling base section 3, and a sheet-shaped or film-shaped adhesive resin having heat resistance and insulation properties, for example, polyimide resin, silicone resin, epoxy resin, acrylic resin, or the like can be given.

A configuration is also acceptable in which an insulating organic adhesive material layer having a three-layer structure is made by further providing a third insulating organic adhesive material layer between the insulating organic adhesive material layers 5 and 6 and the electrostatic chuck section 2 and the cooling base section 3 are bonded to and integrated with each other through the insulating organic adhesive material layer having the three-layer structure. As the third insulating organic adhesive material layer, for example, silicone resin, epoxy resin, acrylic resin, or the like can be given.

It is preferable that the thickness of each of the insulating organic adhesive material layers 5 and 6 be in a range of 100 μm to 500 μm, and more preferably, the thickness is in a range of 150 μm to 300 μm. It is preferable that variation in the in-plane thickness of each of the insulation organic adhesive material layers 5 and 6 be within 10 μm.

Here, if variation in the in-plane thickness of each of the insulating organic adhesive material layers 5 and 6 exceeds 10 μm, variation exceeding 10 μm occurs in the in-plane distance between the heater element 4 and the electrostatic chuck section 2 and the in-plane distance between the heater element 4 and the cooling base section 3, and as a result, the in-plane uniformity of heat between the electrostatic chuck section 2 and the cooling base section 3 is reduced and the in-plane temperature in the placement surface 11a of the electrostatic chuck section 2 becomes non-uniform, and thus the uniformity of the in-plane temperature of the plate-shaped sample W is reduced, and therefore, it is not preferable.

It is preferable that fillers having an average particle size of 1 μm or more and 10 μm or less, for example, surface-coated aluminum nitride (AlN) particles, in each of which a coating layer made of silicon oxide ($SiO_2$) is formed on the surface of an aluminum nitride (AlN) particle, be contained in the insulating organic adhesive material layers 5 and 6.

The surface-coated aluminum nitride (AlN) particles are mixed in the organic adhesive material layers in order to improve the thermal conductivity of the organic adhesive material layers, and by adjusting the mix rate thereof, it is possible to control the heat transfer coefficient of each of the organic adhesive material layers 5 and 6.

That is, by increasing the mix rate of the surface-coated aluminum nitride (AlN) particles, it is possible to increase the heat transfer coefficient of an organic adhesive configuring the organic adhesive material layer 5 on the electrostatic chuck section 2 side.

Further, since the coating layer made of silicon oxide ($SiO_2$) is formed on the surface of the aluminum nitride (AlN) particle, compared to a simple aluminum nitride (AlN) particle on which surface coating is not performed, the surface-coated aluminum nitride (AlN) particle has excellent water resistance. Therefore, it is possible to secure the durability of the organic adhesive material layers 5 and 6, and as a result, it is possible to dramatically improve the durability of the electrostatic chuck device 1.

In the surface-coated aluminum nitride (AlN) particle, since the surface of the aluminum nitride (AlN) particle is coated by the coating layer made of silicon oxide ($SiO_2$) having excellent water resistance, there is no concern that the aluminum nitride (AlN) may be hydrolyzed by water in the atmosphere and there is also no concern that the heat transfer efficient of the aluminum nitride (AlN) may be reduced, and thus the durability of the organic adhesive material layers 5 and 6 is improved.

There is also no concern that the surface-coated aluminum nitride (AlN) particle may become a source of contamination to the plate-shaped sample W such as a semiconductor wafer.

It is preferable that the average particle size of the surface-coated aluminum nitride (AlN) particles be 1 μm or more and 10 μm or less, and more preferably, the average particle size is 2 μm or more and 5 μm or less.

Here, if the average particle size of the surface-coated aluminum nitride (AlN) particles is less than 1 μm, contact between the particles becomes insufficient, and as a result, there is a concern that heat transfer coefficient may be reduced, and if the particle size is too small, workability such as handling is decreased, and therefore, it is not preferable. On the other hand, if the average particle size exceeds 10 μm, the ratio that a resin composition in an organic adhesive layer accounts for is locally reduced, and thus there is a concern that the extensibility and the adhesive strength of the organic adhesive layer may be decreased.

Next, a method of manufacturing the electrostatic chuck device 1 will be described.

First, the plate-shaped placement plate 11 and the plate-shaped support plate 12 are made of an aluminum oxide ($Al_2O_3$) sintered body, an aluminum nitride (AlN) sintered body, an aluminum oxide-silicon carbide ($Al_2O_3$—SiC) composite sintered body, or the like.

For example, in a case where the placement plate 11 and the support plate 12 are made of an aluminum oxide-silicon carbide ($Al_2O_3$—SiC) composite sintered body, each of the placement plate 11 and the support plate 12 can be obtained by molding a powder mix which includes silicon carbide powder and aluminum oxide powder into a desired shape and then performing firing for a predetermined time at a temperature in a range of 1600° C. to 2000° C., for example, and in a non-oxidizing atmosphere, preferably, an inert atmosphere.

Subsequently, a fixing hole for fitting and holding the terminal for power feeding 15 is formed in a plurality in the support plate 12.

Subsequently, the terminal for power feeding 15 is made so as to have a size and a shape capable of being closely fixed to the fixing hole of the support plate 12. As a method of making the terminal for power feeding 15, for example, in a case where the terminal for power feeding 15 is made of a conductive composite sintered body, a method of molding conductive ceramic powder into a desired shape and then performing pressurized firing, or the like can be given.

As the conductive ceramic powder, conductive ceramic powder made of the same material as the internal electrode for electrostatic adsorption 13 is preferable.

Further, in a case where the terminal for power feeding 15 is made of metal, a method to use high melting point metal and form the terminal for power feeding 15 by a metal processing method such as a grinding method, powder metallurgy, or the like can be given.

Subsequently, an application liquid for formation of an internal electrode for electrostatic adsorption, in which a conducting material such as the above-described conductive ceramic powder is dispersed in an organic solvent, is applied onto a predetermined area of the surface of the support plate 12 with the terminal for power feeding 15 fitted therein, so as to come into contact with the terminal for power feeding 15, and drying is then performed, whereby a layer of forming an internal electrode for electrostatic adsorption is formed.

As an application method, in terms of being capable of performing application in a uniform thickness, a screen printing method, a spin coating method, or the like is preferable. Further, as another method, there is a method of forming a film made of the above-described high melting point metal at a predetermined area of the surface of the support plate 12 by a vapor deposition method or a sputtering method, a method to dispose a thin plate made of the above-described conductive ceramics or high melting point metal and form a layer of forming an internal electrode for electrostatic adsorption having a predetermined shape by etching, or the like.

Further, an insulating material layer that includes a powder material having the same composition or the same main component as the placement plate 11 and the support plate 12 is formed on an area other than the area with the layer of forming an internal electrode for electrostatic adsorption formed thereon, on the support plate 12, in order to improve insulation properties, corrosion resistance, and plasma resistance.

The insulating material layer can be formed, for example, by applying an application liquid in which insulating material powder having the same composition or the same main component as the placement plate 11 and the support plate 12 is dispersed in an organic solvent, onto the predetermined area by screen printing or the like and then performing drying.

Subsequently, the placement plate 11 is superimposed on the layer of forming an internal electrode for electrostatic adsorption and the insulating material layer on the support plate 12 and is then integrated therewith by performing hot pressing at a high temperature and high pressure. It is preferable that an atmosphere in the hot pressing be a vacuum or an inert atmosphere such as Ar, He, or $N_2$. Further, it is preferable that the pressure be in a range of 5 MPa to 10 MPa, and it is preferable that the temperature be in a range of 1600° C. to 1850° C.

Due to the hot pressing, the layer of forming an internal electrode for electrostatic adsorption is fired, thereby being turned into the internal electrode for electrostatic adsorption 13 made of a conductive composite sintered body. At the same time, the support plate 12 and the placement plate 11 are joined to and integrated with each other with the insulating material layer 14 interposed therebetween.

Further, the terminal for power feeding 15 is re-fired by hot pressing at a high temperature and high pressure, thereby being closely fixed to the fixing hole of the support plate 12.

Then, the upper and lower surfaces, the outer periphery, a gas hole, and the like of the joined body are machined, whereby the electrostatic chuck section 2 is obtained.

Subsequently, a sheet-shaped or film-shaped organic adhesive material having heat resistance and insulation properties, such as polyimide resin, silicone resin, epoxy resin, or acrylic resin, for example, is stuck to a predetermined area of the surface (the lower surface) of the support plate 12 of the electrostatic chuck section 2, thereby forming the insulating organic adhesive material layer 5.

Subsequently, a non-magnetic metal thin plate such as a titanium (Ti) thin plate, a tungsten (W) thin plate, or a molybdenum (Mo) thin plate, for example, is stuck onto the insulating organic adhesive material layer 5, and the non-magnetic metal thin plate is etched into a desired pattern by a photolithographic method, thereby forming the heater element 4 which includes the heater pattern 21 and the island-shaped portion 24 that is independent from the heater pattern 21.

In this way, an electrostatic chuck section with a heater element is obtained in which the heater element 4 which includes the desired heater pattern 21 and the island-shaped portion 24 that is independent from the heater pattern 21 is formed on the surface (the lower surface) of the support plate 12 with the insulating organic adhesive material layer 5 interposed therebetween.

Subsequently, the terminal for power feeding 22 having a predetermined size and shape is fabricated. It is preferable that a material of the terminal for power feeding 22 be a material of the same quality as the heater pattern 21 and the island-shaped portion 24 of the heater element 4.

Subsequently, the terminal for power feeding 22 is electrically connected to the heater element 4. As a connection method, a method by a screw or welding can be given.

On the other hand, machining is performed on a metal material made of aluminum (Al), an aluminum alloy, copper (Cu), a copper alloy, stainless steel (SUS), or the like, and as necessary, a flow path or the like that circulates water is formed in the inside of the metal material, and in addition, fixing holes for fitting and holding the terminals for power feeding 15 and 22 are formed, whereby the cooling base section 3 is obtained.

It is preferable to perform alumite treatment or form an insulating film such as alumina on at least the surface that is exposed to plasma, of the cooling base section 3.

Subsequently, the joint surface to the electrostatic chuck section 2, of the cooling base section 3, is degreased and cleaned by using, for example, acetone, and a sheet-shaped or film-shaped organic adhesive material having heat resistance and insulation properties, such as acrylic resin, polyimide resin, silicone resin, or epoxy resin, is stuck to a predetermined position on the joint surface, thereby forming the insulating organic adhesive material layer 6.

Subsequently, the insulating organic adhesive material layer 5 of the electrostatic chuck section 2 and the heater element 4 which includes the heater pattern 21 and the island-shaped portion 24 are superimposed on the insulating organic adhesive material layer 6 of the cooling base section 3. At this time, the terminals for power feeding 15 and 22 are inserted and fitted into holes of accommodating the terminals for power feeding (not shown) perforated in the cooling base section 3.

Subsequently, the electrostatic chuck section 2 is pressed with predetermined pressure from above, whereby the electrostatic chuck section 2 and the cooling base section 3 are bonded to and integrated with each other with the heater element 4 which includes the heater pattern 21 and the island-shaped portion 24 and the insulating organic adhesive material layers 5 and 6 interposed therebetween.

By the above, the electrostatic chuck section 2, the heater element 4, and the insulating organic adhesive material layer 5 are joined to and integrated with the cooling base section 3 and the insulating organic adhesive material layer 6, whereby the electrostatic chuck device 1 according to this embodiment is obtained.

According to the electrostatic chuck device 1, since the heater element 4 is configured to include the heater pattern 21 having a predetermined shape, in which a single strip-shaped metal material is meandered, and the island-shaped portion 24 having a predetermined shape, which is provided in the gap portion 23 formed between the heater patterns 21 and is independent from the heater pattern 21, it is possible to uniformize an in-plane temperature distribution in the placement surface 11a on which the plate-shaped sample W is placed.

Further, since the electrostatic chuck section 2 and the cooling base section 3 are bonded to and integrated with each other with the heater element 4 which includes the heater pattern 21 and the island-shaped portion 24 and the insulating organic adhesive material layers 5 and 6 interposed therebetween, it is possible to relieve stress and a difference in thermal expansion between the electrostatic chuck section 2 and the cooling base section 3 by the insulating organic adhesive material layers 5 and 6.

Second Embodiment

Figure 3:
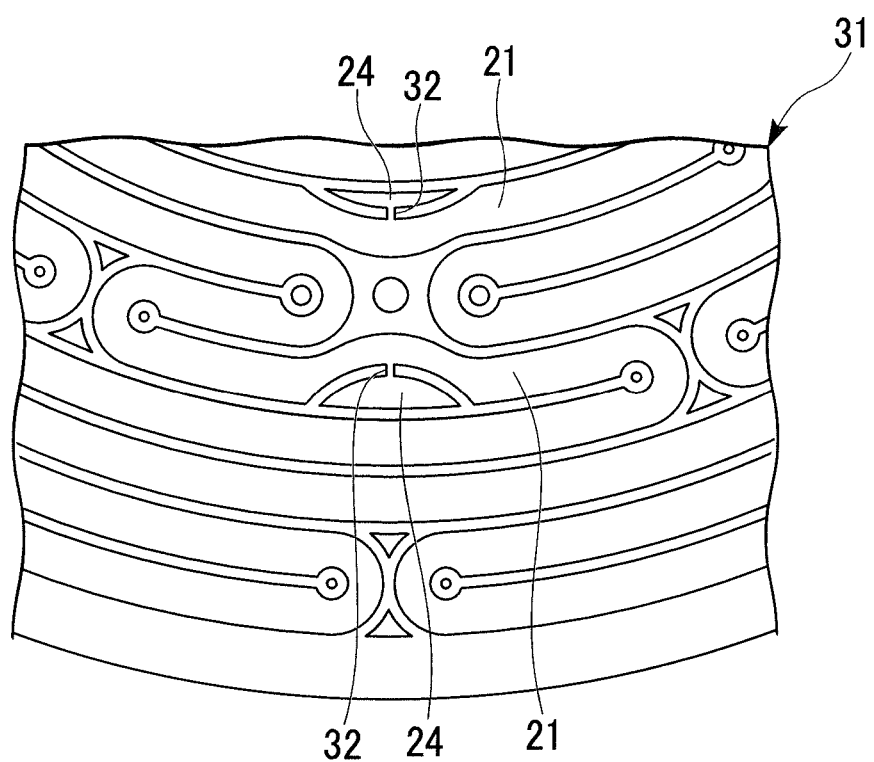
FIG. 3 is a plan view showing a heater element (a heating member) in an area A of an electrostatic chuck device according to a second embodiment of the invention.

FIG. 3 is a plan view showing a heater element (a heating member) 31 at the position corresponding to the area A in the first embodiment, of an electrostatic chuck device according to a second embodiment of the invention, and the heater element 31 in this embodiment is different from the heater element 4 in the first embodiment shown in FIG. 2 in that in the heater element 4 in the first embodiment, the island-shaped portion 24 which is electrically independent from the heater pattern 21 is provided in the gap portion 23 formed between the heater patterns 21, whereas in the heater element 31 in this embodiment, the heater pattern 21 and the island-shaped portion 24 are connected by a connection portion 32 having a smaller cross-sectional area than the heater pattern 21 and made of the same material composition as the heater pattern 21 and the island-shaped portion 24, and other constituent elements are completely the same as those of the heater element 4 in the first embodiment.

The connection portion 32 is formed by etching the same non-magnetic metal thin plate as the heater pattern 21 and the island-shaped portion 24, for example, a titanium (Ti) thin plate, a tungsten (W) thin plate, a molybdenum (Mo) thin plate, or the like into a desired shape. If the etching is performed at the same time as the etching of the heater pattern 21 and the island-shaped portion 24, it is possible to accurately form the connection portion 32, a process is not changed, and there is also no concern that a manufacturing process may be increased, and therefore, it is preferable.

The shape of the connection portion 32 is formed by a single strip-shaped metal material having a width of 2000 μm or less, preferably, 1000 μm or less, and a thickness of 300 μm or less, preferably, 100 μm or less, and the cross-sectional area thereof is 600,000 μm$^2$ or less, preferably, 100,000 μm$^2$ or less.

On the other hand, the heater pattern 21 is made of a single strip-shaped metal material having a width of 10 mm (10000 μm) or less, preferably, 3 mm (3000 μm) or less, and a thickness of 300 μm or less, preferably, 100 μm or less, and the cross-sectional area thereof is 3,000,000 μm$^2$ or less, preferably, 300,000 μm$^2$ or less.

Therefore, the cross-sectional area of the connection portion 32 is made smaller than the cross-sectional area of the heater pattern 21.

According to this electrostatic chuck device, since the heater pattern 21 and the island-shaped portion 24 are connected by the connection portion 32 having a smaller cross-sectional area than the heater pattern 21, it is possible to make the heater pattern 21 and the island-shaped portion 24 be an equipotential, and thus it is possible to uniformize the high-frequency permeability and a difference in potential of the entirety of the heater element 31 which includes the heater pattern 21, the island-shaped portion 24, and the connection portion 32. Therefore, it is possible to uniformize plasma density on a plate-shaped sample, and thus it is possible to improve the in-plane uniformity of plasma etching of the plate-shaped sample.

In addition, in the electrostatic chuck devices according to the first and second embodiments of the invention, a configuration is made in which a single island-shaped portion 24 which is independent from the heater pattern 21 is provided in the gap portion 23 formed by moving the parallel portions of the heater patterns 21 in a direction away from each other. However, a configuration may also be made in which two or more island-shaped portions 24 are provided in the gap portion 23.

Further, a configuration is also acceptable in which a portion of the heater pattern 21 is expanded, a gap portion is made by forming a hole in the expanded portion, and the island-shaped portion 24 which is independent from the heater pattern 21 is provided in the gap portion.

EXAMPLES

Hereinafter, the invention will be specifically described by using examples and a comparative example. However, the invention is not limited by these examples.

Example 1

Fabrication of Electrostatic Chuck Device

The electrostatic chuck section 2 with the internal electrode for electrostatic adsorption 13 having a thickness of 10 μm embedded inside was fabricated by a known method.

The placement plate 11 of the electrostatic chuck section 2 was an aluminum oxide-silicon carbide composite sintered body containing 10% by mass of silicon carbide and had a disk shape having a diameter of 300 mm and a thickness of 0.5 mm.

Further, the support plate 12 was also an aluminum oxide-silicon carbide composite sintered body containing 10% by mass of silicon carbide, similar to the placement plate 11, and had a disk shape having a diameter of 300 mm and a thickness of 3 mm.

The electrostatic chuck section 2 having an overall diameter of 300 mm and an overall thickness of 4 mm was fabricated by joining and integrating the placement plate 11 and the support plate 12 with the internal electrode for electrostatic adsorption 13 and the insulating material layer 14 interposed therebetween, then performing machining, and forming a large number of projection portions each having a height of 40 μm on an electrostatic adsorption surface of the placement plate 11 so as to make the electrostatic adsorption surface be a concave-convex surface.

On the other hand, the cooling base section 3 made of aluminum and having a diameter of 350 mm and a height of 30 mm was fabricated by machining. The flow path 18 used to circulate a refrigerant was formed in the inside of the cooling base section 3.

Subsequently, an insulating organic adhesive material sheet was stuck to the surface (the lower surface) of the support plate 12 of the electrostatic chuck section 2, thereby forming the insulating organic adhesive material layer 5.

Subsequently, a titanium (Ti) thin plate having a thickness of 100 μm was stuck onto the insulating organic adhesive material layer 5, thereby bonding and fixing the electrostatic chuck section 2 and the titanium (Ti) thin plate to each other.

Subsequently, the titanium (Ti) thin plate was etched into a predetermined heater pattern 21 and the island-shaped portion 24 by a photolithographic method, thereby forming the heater element 4. Further, the terminal for power feeding 22 made of titanium was provided to be erect at the heater element 4 by using a welding method, and the terminal for power feeding 15 was fitted into and fixed to the fixing hole of the electrostatic chuck section 2.

In this way, an electrostatic chuck section with a heater element was obtained.

Subsequently, an insulating organic adhesive material sheet was stuck to a predetermined position of the joint surface to the electrostatic chuck section 2 of the cooling base section 3, thereby forming the insulating organic adhesive material layer 6.

In this way, a cooling base section with an insulating organic adhesive material layer was obtained.

Subsequently, the heat element side of the electrostatic chuck section with the heater element was superimposed on the insulating organic adhesive material layer side of the cooling base section with an insulating organic adhesive material layer made of a silicone adhesive interposed therebetween, whereby the electrostatic chuck section 2 and the cooling base section 3 were bonded and fixed to each other through an insulating organic adhesive material layer having a three-layer structure, and thus an electrostatic chuck device of Example 1 was fabricated.

(Evaluation)

An in-plane temperature distribution in the placement surface of the electrostatic chuck device was measured and evaluated. The evaluation method and evaluation results thereof are as follows.

(In-Plane Temperature Distribution)

A silicon wafer having a diameter of 300 mm was electrostatically adsorbed to the placement surface 11a of the electrostatic chuck section 2, the heater element 4 was energized while circulating cooling water of 20° C. in the flow path 18 of the cooling base section 3, so as to obtain the center temperature of the silicon wafer of 60° C., and an in-plane temperature distribution of the silicon wafer at this time was measured using Thermography TVS-200EX (manufactured by Nippon Avionics Co., Ltd.). As a result, a difference between the center temperature in one diameter direction of the silicon wafer and the temperature of a peripheral portion was 1° C. and was within ±1° C.

Example 2

An electrostatic chuck device of Example 2 was fabricated in the same manner as in Example 1 except that the heater element 31 was made by etching a titanium (Ti) thin plate into a predetermined heater pattern 21, the island-shaped portion 24, and the connection portion 32 by a photolithography method.

Subsequently, an in-plane temperature distribution in the placement surface of the electrostatic chuck device was measured and evaluated in the same manner as in Example 1. As a result, a difference between the center temperature in one diameter direction of the silicon wafer and the temperature of a peripheral portion was 1° C. and was within ±1° C.

Comparative Example

An electrostatic chuck device of a comparative example was fabricated in the same manner as in Example 1 except that a heater element was made by etching a titanium (Ti) thin plate into a spiral heater pattern by a photolithography method.

Subsequently, an in-plane temperature distribution in the placement surface of the electrostatic chuck device was measured and evaluated in the same manner as in Example 1. As a result, the difference between the center temperature in one diameter direction of the silicon wafer and the temperature of a peripheral portion was 2° C. and was beyond a range of ±2° C.

(Plasma Uniformity Evaluation)

Evaluation of plasma uniformity in the electrostatic chuck device of each of Examples 1 and 2 and the comparative example was performed.

Here, the electrostatic chuck device was mounted in a treatment vessel of a plasma etching device and a plate-shaped sample was placed on a placement surface of the electrostatic chuck device. As the plate-shaped sample, a wafer having a diameter of 300 mm (12 inches) in which a resist film was formed on a surface was used.

Then, asking treatment of the resist film was performed by generating plasma while fixing the wafer to the placement surface by electrostatic adsorption by application of direct current of 2500 V. The inside of the treatment vessel had an $O_2$ gas (supplied at 100 sccm) atmosphere of 0.7 Pa (5 mTorr), high-frequency power for plasma generation had a frequency of 100 MHz and was 2 kW, He gas having a predetermined pressure (15 Torr) was made to flow in the gap between the placement plate 11 of the electrostatic chuck device and the wafer from a cooling gas introduction hole, and cooling water of 20° C. was made to flow in the flow path 18 of the cooling base section 3.

After the end of the asking treatment, a change in the film thickness of the resist film was measured so as to pass through an island-shaped structure portion of a heater from a central portion to an outer peripheral portion of the wafer and in-plane uniformity of an etching amount was observed.

According to these evaluation results, in the electrostatic chuck device of Example 1, the etching amount was almost the same from the central portion to the outer peripheral portion of the wafer. However, the etching amount slightly increased on the island-shaped portion. It was found that in the electrostatic chuck device of Example 2, the etching amount was almost the same from the central portion to the outer peripheral portion of the wafer and plasma uniformity was the best.

INDUSTRIAL APPLICABILITY

The invention can be applied to an electrostatic chuck device in which uniformizing an in-plane temperature distribution in a placement surface on which a plate-shaped sample such as a wafer is placed is required and improving in-plane uniformity of plasma etching of a plate-shaped sample by uniformizing plasma density on the plate-shaped sample is required.

REFERENCE SIGNS LIST

1: electrostatic chuck device
2: electrostatic chuck section
3: cooling base section
4: heater element (heating member)
5, 6: insulating organic adhesive material layer
11: placement plate
11a: placement surface
12: support plate
13: internal electrode for electrostatic adsorption
14: insulating material layer
15: terminal for power feeding
18: flow path
21: heater pattern
22: terminal for power feeding
23: gap portion
24: island-shaped portion
31: heater element (heating member)
32: connection portion
A: area
W: plate-shaped sample

The invention claimed is:

1. An electrostatic chuck device comprising:
an electrostatic chuck section that has a principal surface as a placement surface on which a plate-shaped sample is placed, and is made to have an internal electrode for electrostatic adsorption built-in; and
a cooling base section that cools the electrostatic chuck section,
wherein a heating member having a heater pattern of a predetermined shape is provided between the electrostatic chuck section and the cooling base section, and one or more island-shaped portions that are independent from the heater pattern and are made of the same material as the heater pattern are provided in any one or both of a gap portion of the heater pattern and an inside of the heater pattern.

2. The electrostatic chuck device according to claim 1, wherein the heater pattern and the island-shaped portion are connected by a connection portion having a smaller cross-sectional area than the heater pattern.

3. The electrostatic chuck device according to claim 2, wherein the heater pattern and the island-shaped portion or the connection portion are made of a non-magnetic metal material.

4. The electrostatic chuck device according to claim 2, wherein the heater pattern and the island-shaped portion or the connection portion are bonded to and integrated with the electrostatic chuck section and the cooling base section by an insulating organic adhesive material layer.

* * * * *